(12) United States Patent
Misek et al.

(10) Patent No.: US 7,687,836 B2
(45) Date of Patent: Mar. 30, 2010

(54) CAPACITANCE NOISE SHIELDING PLANE FOR IMAGER SENSOR DEVICES

(75) Inventors: Brian Misek, Fort Collins, CO (US); Ray Alan Mentzer, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/753,190

(22) Filed: May 24, 2007

(65) Prior Publication Data

US 2008/0290381 A1 Nov. 27, 2008

(51) Int. Cl.
*H01L 31/062* (2006.01)
*H01L 31/113* (2006.01)

(52) U.S. Cl. ....................................... 257/291
(58) Field of Classification Search ................. 257/233, 257/238–239, 257, 291–294, 432–466, E27.133; 438/48, 54, 65, 69, 70
See application file for complete search history.

(56) References Cited

U.S. PATENT DOCUMENTS

| | | | |
|---|---|---|---|
| 5,374,837 A | 12/1994 | Uno | |
| 6,759,262 B2 | 7/2004 | Theil | |
| 7,046,284 B2 | 5/2006 | Kozlowski et al. | |
| 2003/0127647 A1 | 7/2003 | Street et al. | |
| 2005/0205901 A1* | 9/2005 | Suzuki | 257/291 |
| 2006/0001059 A1* | 1/2006 | Mouli et al. | 257/292 |
| 2006/0187326 A1 | 8/2006 | Spencer | |
| 2006/0208162 A1* | 9/2006 | Inuiya | 250/208.1 |
| 2006/0267054 A1 | 11/2006 | Martin et al. | |
| 2007/0012969 A1 | 1/2007 | Mouli | |
| 2007/0018266 A1 | 1/2007 | Dupont et al. | |
| 2007/0052035 A1 | 3/2007 | Nagaraja et al. | |
| 2007/0099389 A1 | 5/2007 | Rossi | |

FOREIGN PATENT DOCUMENTS

| | | |
|---|---|---|
| JP | 02106969 | 4/1990 |
| JP | 02244764 | 9/1990 |
| KR | 970004494 | 3/1997 |

OTHER PUBLICATIONS

Ito, H. et al.; a-Si:H TFT Array Driven Linear Image Sensor with Capacitance Coupling Isolation Structure; Electron Devices Meeting; 1985 International; vol. 31, pp. 436-439.

* cited by examiner

*Primary Examiner*—Dao H Nguyen
*Assistant Examiner*—Tram H Nguyen

(57) ABSTRACT

A conductive shield plane electrically isolating the photodiode regions from metal interconnect lines in an imager sensor device.

2 Claims, 6 Drawing Sheets

CAPACITANCE NOISE SHIELDING PLANE FOR IMAGER SENSOR DEVICES

TECHNICAL FIELD

This invention relates to semiconductor imaging devices and more specifically to a conductive ground plane for imager sensor pixel cells in semiconductor integrated circuit devices.

BACKGROUND

Previous generations of camera imager sensors have had few and easily resolvable problems with fixed pattern artifacts in the imager resulting from overlying metal layers of interconnect in the device. The previous camera imager sensors did not require lens compensation as the patterning of the metal interconnects was a regular pattern across the entire imager sensor array.

The current generation of an imager sensor, such as a Complimentary Metal Oxide Semiconductor (CMOS) imager sensor, however presents challenges to correct fixed pattern artifacts. In general, a CMOS imager sensor circuit includes a focal plane array of CMOS imager sensor cells (or pixels), each one of the pixels includes a photo-conversion device, e.g., a photogate, photoconductor, or photodiode having an associated charge accumulation region within a substrate for accumulating photo-generated charge. Each pixel may include a transistor for transferring charge from the charge accumulation region to a diffusion node and a transistor for resetting the diffusion node to a predetermined charge level prior to charge transference. The pixel may also include a source follower transistor for receiving and amplifying charge from the diffusion node and an access transistor for controlling the readout of the pixel contents from the source follower transistor. In some arrangements, the transfer transistor is omitted and the charge accumulation region is coupled with the diffusion node.

In a CMOS imager sensor cell, the active elements of a pixel perform the necessary functions of: (1) photon to charge conversion; (2) accumulation of imager charge; (3) transfer of charge to the diffusion node accompanied by charge amplification (where a transfer transistor is used); (4) resetting the diffusion node to a known state before the transfer of charge to it; (5) selection of a pixel for readout; and (6) output and amplification of a reset signal and a signal representing pixel charge from the diffusion node. The charge at the floating diffusion node is typically converted to a pixel output voltage by the source follower output transistor.

Current generations of pixel arrays, such as current CMOS imager sensor arrays, utilize metal and micro lens shifting to boost the response to incident light for pixels located away from the center of the pixel array. This shifting is an increasing continuum from the center of the pixel array out to the sides. The shifting has proven to have positive effects of increasing pixel sensitivity to light as well as a reduction of pixel crosstalk, but at the expense of difficult fixed pattern artifacts. These fixed pattern artifacts are a result of electrical coupling from reset and charge transfer transistors to underlying conductive networks in the pixel, namely the photodiode (PD) and the floating diffusion (FD). One could attempt to shift the overlying metal interconnect lines and route them over non-critical areas outside the PD and FD, but due to the increasingly reducing of pixel sizes, such as 2.2 micron and smaller pixel, the non-critical areas are extremely limited.

"The electrical coupling from reset and charge transfer transistors to lower conductive networks (i.e., parasitic capacitance between overlying level metal and underlying level polysilicon and implant regions) is illustrated in FIG. 1, a simplified illustration of a top-down view depicting an imager sensor pixel segment of a CMOS imager sensor device 100. A typical arrangement of photodiode region 102 resides in silicon substrate 101 and overlying metal 1 line 103 and metal 2 lines 104 that are used to connect to transistor gates (not shown) that control and access the imager sensor pixel, the general layout and function of which are known to those skilled in the art."

FIG. 2 is a simplified cross-sectional view of FIG. 1 depicting parasitic capacitance that can be present between the overlying metal lines and the photodiode region 102 of the imager sensor pixel 100. As seen in FIG. 2, parasitic capacitance ($C_1$) 205 develops between metal 1 line 103 and photodiode region 102, while parasitic capacitance ($C_2$) 206 develops between metal 2 lines 104 and photodiode region 102. As discussed previously, the parasitic capacitance creates undesirable fixed pattern artifacts.

FIG. 3 is a simplified illustration of a top-down view depicting a backside illumination imager sensor pixel segment of a CMOS imager sensor device 300. A typical arrangement of photodiode region 302 resides in silicon substrate 301 and overlying metal 1 line 303 and metal 2 lines 304 that are used to connect to transistor gates (not shown) that control and access the imager sensor pixel, the general layout and function of which are know to those skilled in the art.

FIG. 4 is a simplified cross-sectional view of FIG. 3 depicting parasitic capacitance that can be present between the overlying metal lines and the backside illumination photodiode region 302 of the imager sensor pixel 300. As seen in FIG. 4, parasitic capacitance ($C_1$) 305 develops between metal 1 line 303 and photodiode region 302, while parasitic capacitance ($C_2$) 306 develops between metal 2 lines 304 and photodiode region 302. As discussed previously, the parasitic capacitance creates undesirable fixed pattern artifacts.

The parasitic capacitance that can form in an imager sensor device, including backside illuminated devices, namely between overlying metal and underlying implanted regions, namely the photodiode (PD) and the floating diffusion (FD), is an area that needs addressed in the CMOS imager sensor industry.

Therefore, what is needed in the art is a means to electrically isolate overlying metals and their associated parasitic capacitance from underlying levels of polysilicon and conductively implanted regions for an imager sensor pixel array.

DETAILED DESCRIPTION

In the following detailed description, reference is made to the accompanying drawings, which form a part hereof, and in which is shown by way of illustration of specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on other semiconductors including silicon-germanium, germanium, or gallium-arsenide. Also, a semiconductor supporting material, such as glass or an organic material, etc., may be used as a supporting material for a backside illumination device.

The term "pixel" refers to a picture element unit cell containing a photosensor and transistors for converting electromagnetic radiation to an electrical signal. The phrase "optically clear conductive material" refers to any conductive material that will allow a substantial amount of the necessary wavelengths of light to pass through it in order to allow for light collection in an imager gathering photosensor, such as an imager sensor pixel. The phrase "parasitic capacitance" is meant to be interpreted both in a singular or plural sense, in that multiple capacitive parasitics may form between conductive surfaces, yet they may be lumped together and considered to be a single parasitic capacitance for sake of discussion and analysis.

Preferred embodiments of the present disclosure provide electrical isolation between overlying level metals and their associated parasitic capacitance from underlying levels of polysilicon and conductively implanted regions for a imager sensor pixel array, such as for CMOS imager sensor devices, as described below with reference to FIGS. 5-9.

Figure 1:
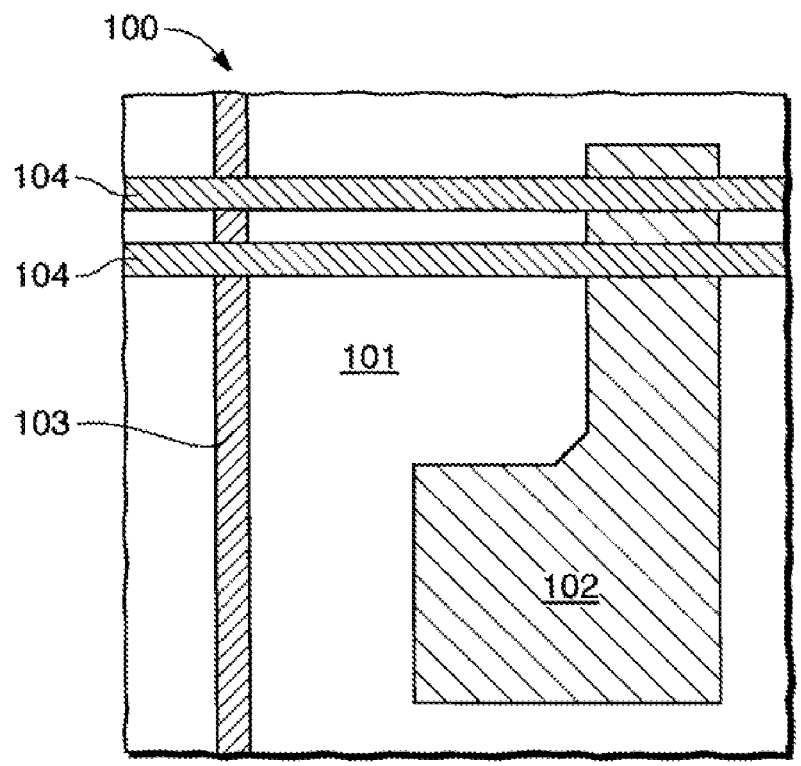
FIG. 1 is a simplified illustration of a top-down view depicting an imager sensor pixel segment of a CMOS imager sensor device.
Figure 2:
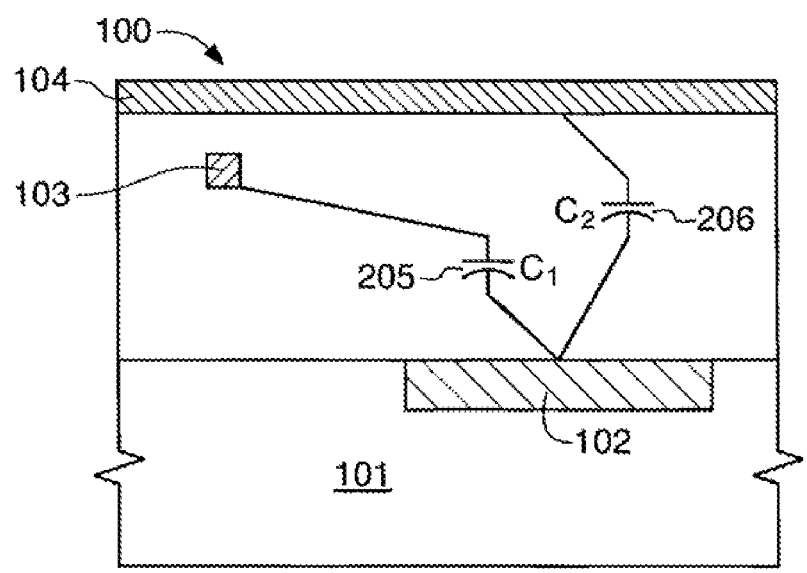
FIG. 2 is a simplified cross-sectional view of FIG. 1 depicting parasitic capacitance between overlying metal interconnects and the photodiode of the imager sensor pixel.
Figure 3:
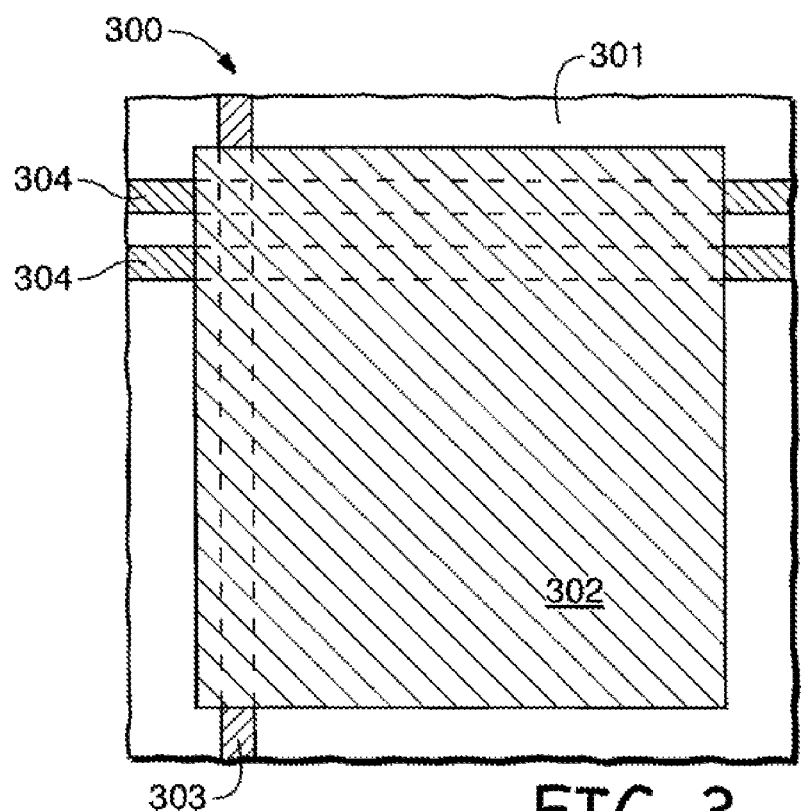
FIG. 3 is a simplified illustration of a top-down view depicting a backside illumination imager sensor pixel segment of a CMOS imager sensor device.
Figure 4:
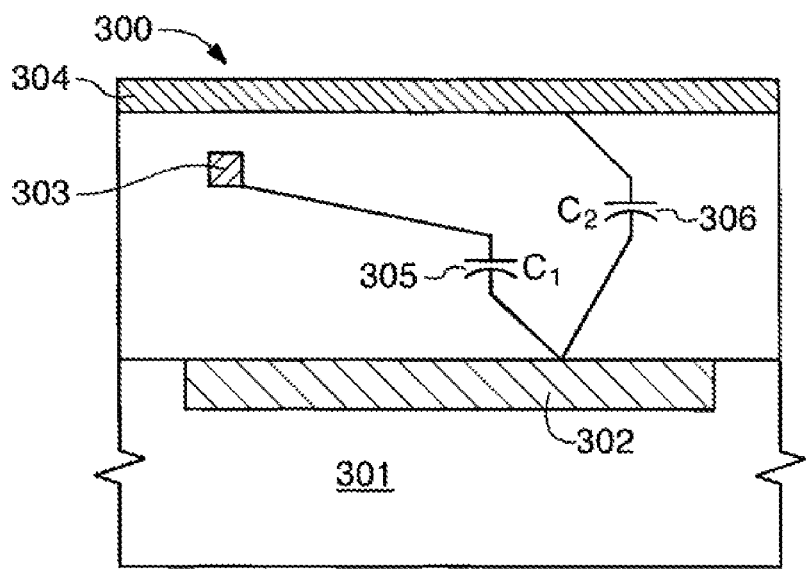
FIG. 4 is a simplified cross-sectional view of FIG. 3 depicting parasitic capacitance between first level metal interconnects and the backside illumination photodiode of the imager sensor pixel.
Figure 5:
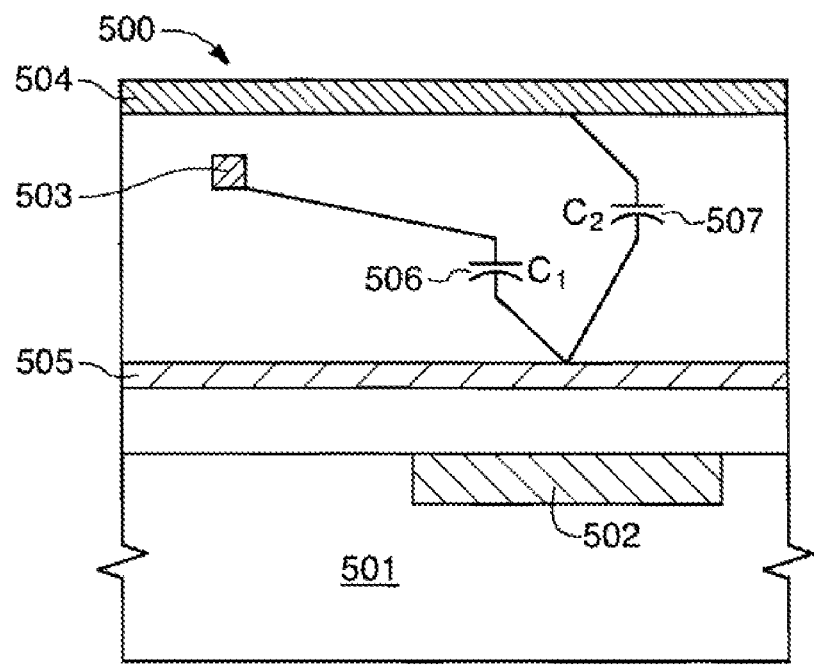
FIG. 5 is a simplified cross-sectional view of a first embodiment of the present disclosure showing a clear conductive material inserted between the active regions of an imager sensor pixel segment and overlying metal lines.

A first embodiment of the present disclosure is depicted in a simplified cross-sectional view of FIG. 5 showing a general relationship between metal interconnect lines and a photodiode region of an imager sensor pixel segment that also may be considered as representing an array of imager pixels. Referring now to FIG. 5, an imager pixel segment 500 is constructed on a silicon substrate using fabrication techniques known to those skilled in the art. FIG. 5 shows substrate region 501 containing photodiode region 502 (which can be considered as encompassing conductive networks in the pixel, namely the photodiode (PD) and the floating diffusion (FD) of the imager pixel).

An optically clear conductive material 505, such as indium oxide ($In_2O_3$), tin oxide ($SnO_2$), or indium tin oxide ($In_xSn_yOz$, also referred to as ITO), overlies the photodiode region 502 such that it resides between the photodiode region 502 a metal 1 interconnect line 503 and metal 2 interconnect lines 504. With the arrangement the optically clear conductive material 505 provides a continuous conductive shield plane to-locations beyond an array of imager pixels. With the presence of optically clear conductive material 505 as indicated, parasitic capacitance now develop between the overlying metal lines and optically clear conductive material 505 rather than to the photodiode region 502. As seen in FIG. 5, parasitic capacitance ($C_1$) 506 develops between metal 1 line 503 and optically clear conductive material 505, while parasitic capacitance ($C_2$) 507 develops between metal 2 lines 504 and optically clear conductive material 505. The optically clear conductive material 505 will have its own parasitic capacitance associated with the underlying conductive silicon nodes of the imager sensor array; each parasitic capacitance will be common to all imager sensor pixels. It is the commonality of the parasitic capacitance among all imager sensor pixels that attenuates fixed pattern noise. Thus, the addition of optically clear conductive material 505 electrically isolates metal interconnect lines and their associated parasitic capacitance from the photodiode regions and conductive implant regions of each imager pixel in the imager pixel array.

Figure 6:
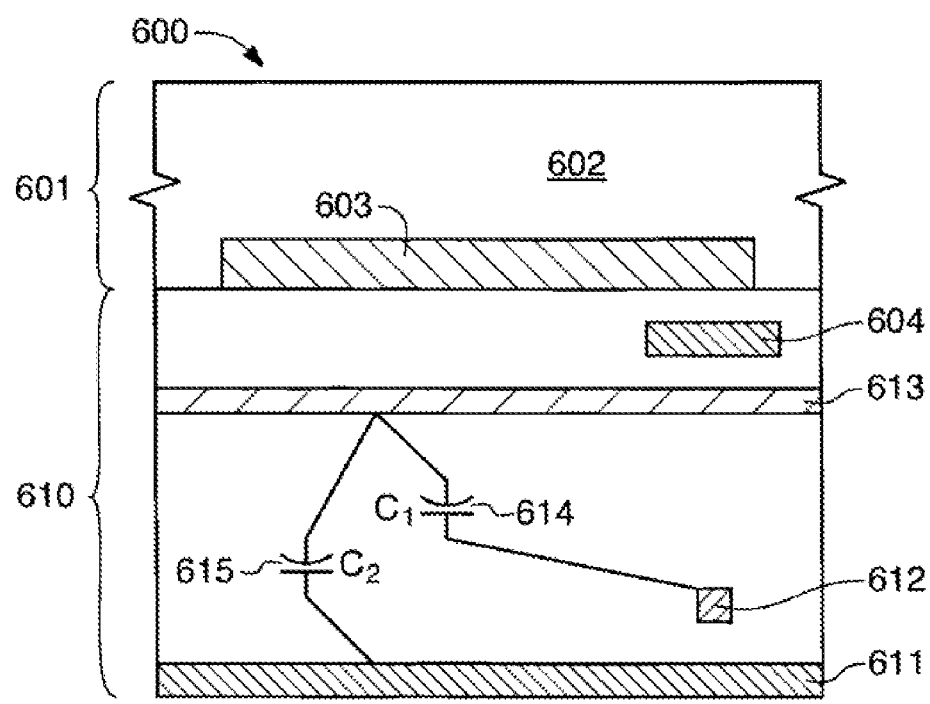
FIG. 6 is a simplified cross-sectional view of a second embodiment of the present disclosure showing a conductive material inserted between the active regions of a backside illumination photodiode of an imager sensor pixel segment and overlying metal lines.

A second embodiment of the present disclosure is depicted simplified cross-sectional view of FIG. 6 showing a general relationship between metal interconnect lines and a photodiode region of an imager sensor pixel segment 600 that also may be considered as representing an array of imager pixels. Referring now to FIG. 6, an imager pixel segment 600 is constructed from wafer 1 section 601 and wafer 2 section 610 using fabrication techniques known to those skilled in the art. Substrate region 602 of wafer section 601 contains photodiode region 603 (which can be considered as encompassing conductive networks in the pixel, namely the photodiode (PD) and the floating diffusion (FD) of the imager pixel). A metal 1 interconnect line 604 makes connection as needed to various electrical components of the imager sensor pixel segment 600. On wafer 2 section 610, metal 1 interconnect lines 611 and metal 2 interconnect line 612 are routed as needed to make connection within the imager sensor pixel and to the rest of the imager sensor pixel array.

A conductive material 613, such as an optically clear conductive material, including indium oxide ($In_2O_3$), tin oxide ($SnO_2$), or indium tin oxide ($In_xSn_yOz$, also referred to as ITO), overlies metal 1 interconnect lines 611 and metal 2 interconnect line 612 of wafer 2 section 610 such that it resides between a metal 1 interconnect line 604 and the photodiode region 603 of wafer 1 section 601. With this arrangement the optically clear conductive material 613 provides a continuous conductive ground plane to substrate grounding locations beyond an array of imager sensor pixels. With the presence of optically clear conductive material 613 as indicated, parasitic capacitance now develop between the metal lines of wafer 2 section 610 and optically clear conductive material 613 rather than to the photodiode region 603 of wafer 1 section 601. As seen in FIG. 6, parasitic capacitance ($C_1$) 614 develops between metal 2 line 612 and optically clear conductive material 613, while parasitic capacitance ($C_2$) 615 develops between metal 1 lines 611 and optically clear conductive material 613. Though the optically clear conductive material 613 will have its own parasitic capacitance associated with the underlying conductive silicon nodes of the imager sensor array, each parasitic capacitance will be common to all imager sensor pixels. It is the commonality of the parasitic capacitance among all imager sensor pixels that attenuates fixed pattern noise. Thus, the addition of optically clear conductive material 613 electrically isolates metal interconnect lines and their associated parasitic capacitance from the photodiode regions and conductive implant regions of each imager pixel in the imager pixel array.

With the backside illumination device, such as a device illustrated in the simplified cross-sectional view of FIG. 6, though it is preferred that conductive material 613 be an optically clear conductive material, the conductive material 613 could also be a reflective conductive layer or a non-reflective conductive layer. The advantage of a reflective layer would be that light that passed all the way through the photodiode would be sent back into the diode and could be captured resulting in a higher efficiency. The advantage of the non reflective approach is that many existing conductive material already in use in the electronics industry can be utilized.

Figure 7:
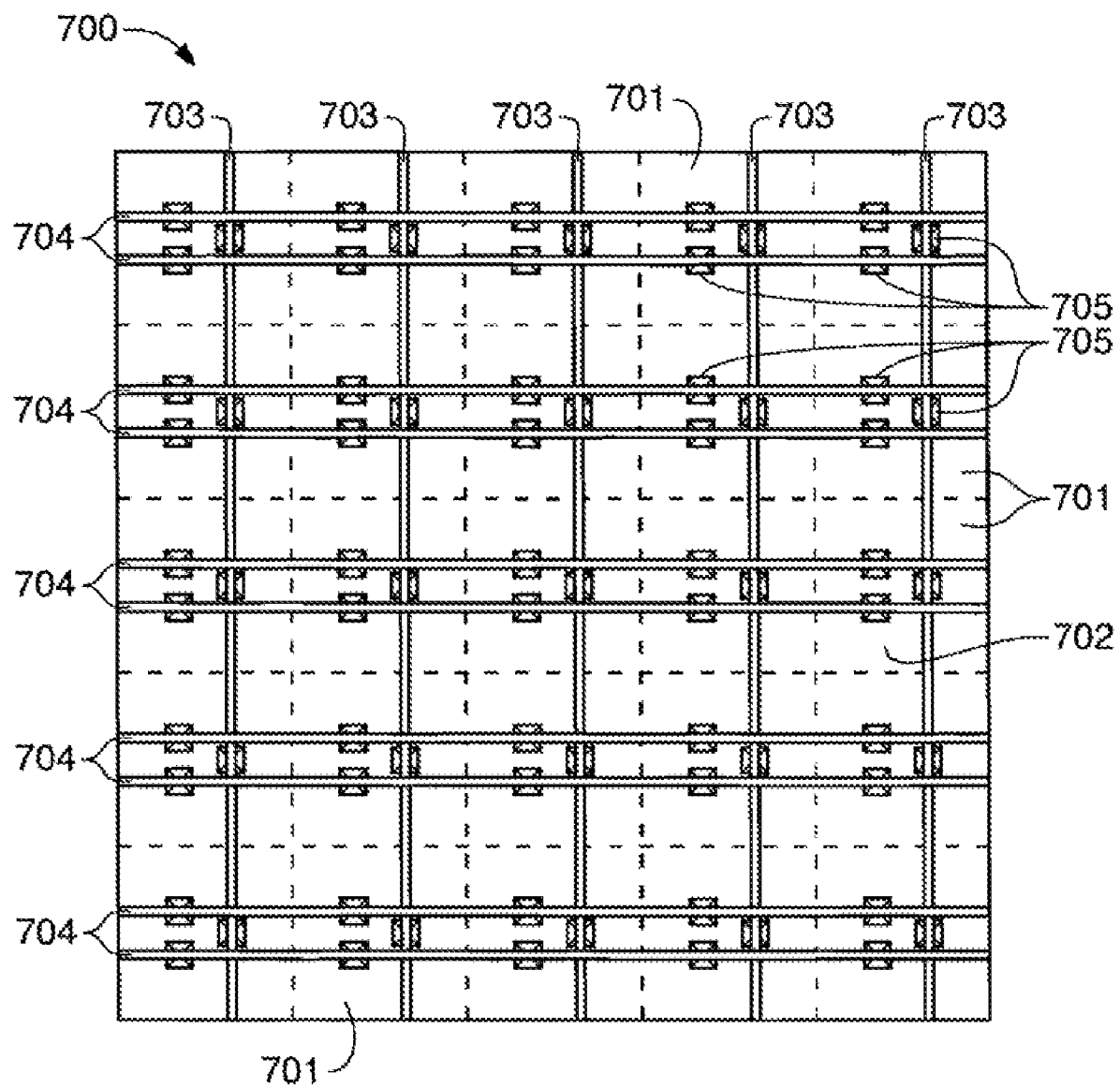
FIG. 7 is an overhead view of an imager array segment utilizing the clear conductive ground plane in a device layout using a non-radially compensated metal for optical response.

FIG. 7 is an overhead view of an imager array segment 700 of imager sensor pixels 701, utilizing the optically clear conductive ground plane in a device layout using a non-radially compensated metal for optical response. The imager array segment 700 of FIG. 7 represents an imager array of any size and with this layout (no metal line shifting) there will be no parasitic capacitance mismatch from pixel to pixel, but this layout has a significant optical problem that is corrected with the use of the optically clear conductive ground plane of the present disclosure as presented in the following discussion.

The entire imager array segment 700 is covered with a optically clear conductive material 702, such as indium oxide ($In_2O_3$), tin oxide ($SnO_2$), or indium tin oxide ($In_xSn_yOz$, also referred to as ITO), to function as a ground plane to the overlying metal 1 lines 703 and metal 2 lines 704, thus electrically isolating the photodiode regions and implanted regions (not seen) in underlying imager sensor pixels 701 from the overlying metal lines 703 and 704. The optically clear conductive material 702 is patterned and electrically isolated from conductive vias 705 that extend through the material and make appropriate connection to the overlying metal lines 703 and 704. Though not shown, optically clear conductive material 702 is also electrically isolated from the overlying metal lines 703 and 704, however the optically clear conductive material 702 is not needed to mitigate parasitic capacitance mismatch from pixel to pixel. However, the addition of optically clear conductive material 702 electrically isolates metal interconnect lines and their associated parasitic capacitance from the photodiode regions and conductive implant regions of each imager pixel in the imager pixel array.

Figure 8:
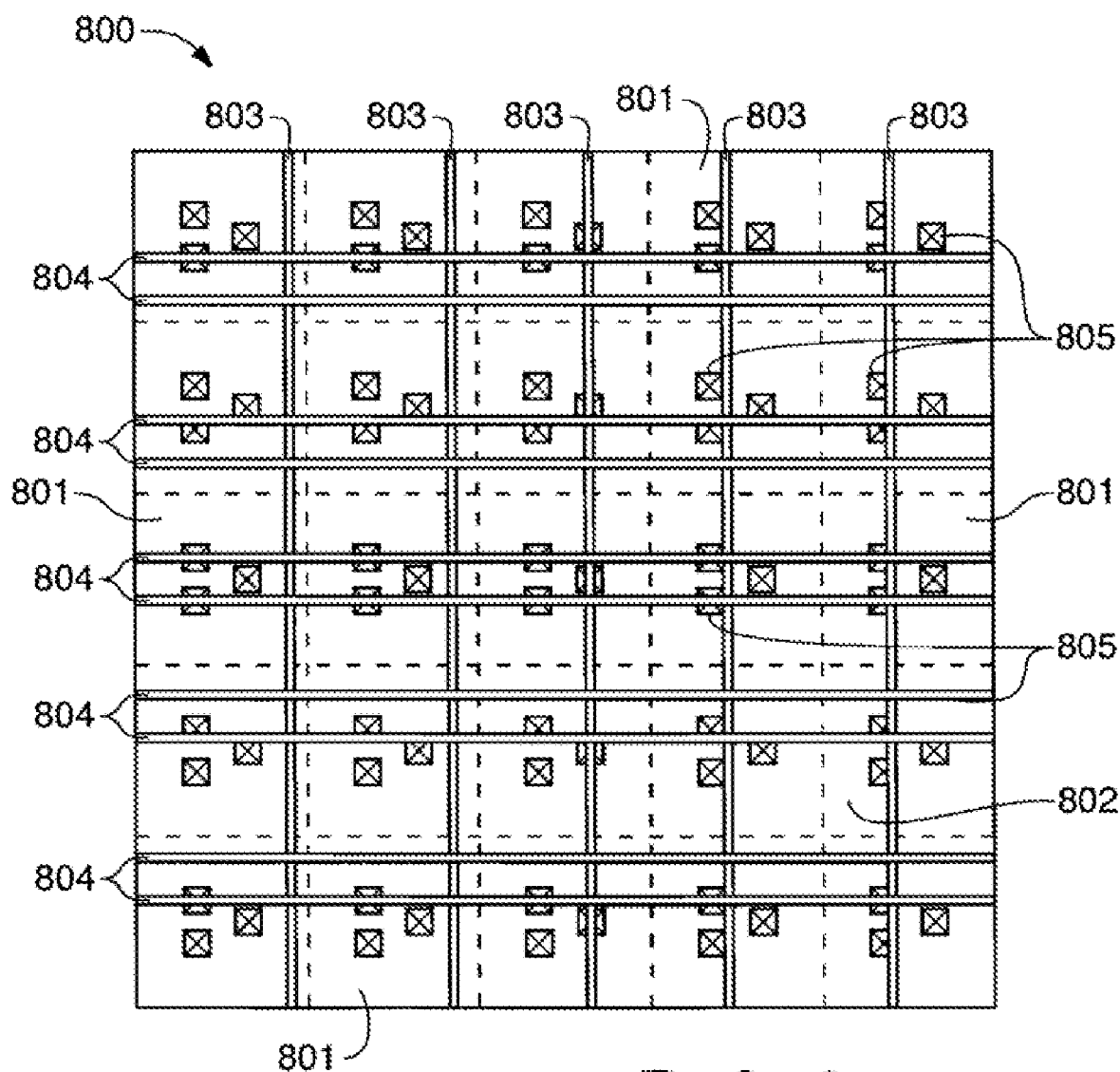
FIG. 8 is an overhead view of an imager array segment utilizing the clear conductive ground plane in a device layout using a radially compensated metal for optical response.

"FIG. 8 is an overhead view of an imager array segment 800 of imager sensor pixels 801, utilizing the optically clear conductive ground plane in a device layout using a radially compensated metal for optical response. The imager array segment 800 of FIG. 8 represents a conceptual example showing metal line shifting to improve optical performance of an imager array of any size. In the absence of an optically clear conductive ground plane each of the imager sensor pixel regions shown will have a different parasitic capacitance. To correct the parasitic capacitance mismatch from pixel to pixel, the entire imager array segment 800 is covered with a optically clear conductive material 802, such as indium oxide ($In_2O_3$), tin oxide ($SnO_2$), or indium tin oxide ($In_xSn_yOz$, also referred to as ITO), to function as a ground plane to the overlying metal 1 lines 803 and metal 2 lines 804, thus electrically isolating the photodiode regions and implanted regions (not seen) in underlying imager sensor pixels 801 from the overlying metal lines 803 and 804. The optically clear conductive material 802 is patterned and electrically isolated from conductive vias 805 that extend through the material and make appropriate connection to the overlying metal lines 803 and 804. Though not shown, optically clear conductive material 802 is also electrically isolated from the overlying metal lines 803 and 804. The inclusion of optically clear conductive ground plane over the array of imager sensor pixels will match the parasitic capacitance in all of the imager sensor pixel regions. Thus, the addition of optically clear conductive material 802 electrically isolates metal interconnect lines and their associated parasitic capacitance from the photodiode regions and conductive implant regions of each imager pixel in the imager pixel array.

In each of the preferred embodiments a conductive material, preferably an optically clear conductive material, isolates the photodiode from random or pseudo random placement of overlying metals. Though the optically clear conductive material will have its own parasitic capacitance associated with the underlying conductive silicon nodes, each parasitic capacitance will be common to all imager sensor pixels. It is the commonality of the parasitic capacitance among all imager sensor pixels that attenuates fixed pattern noise.

Figure 9:
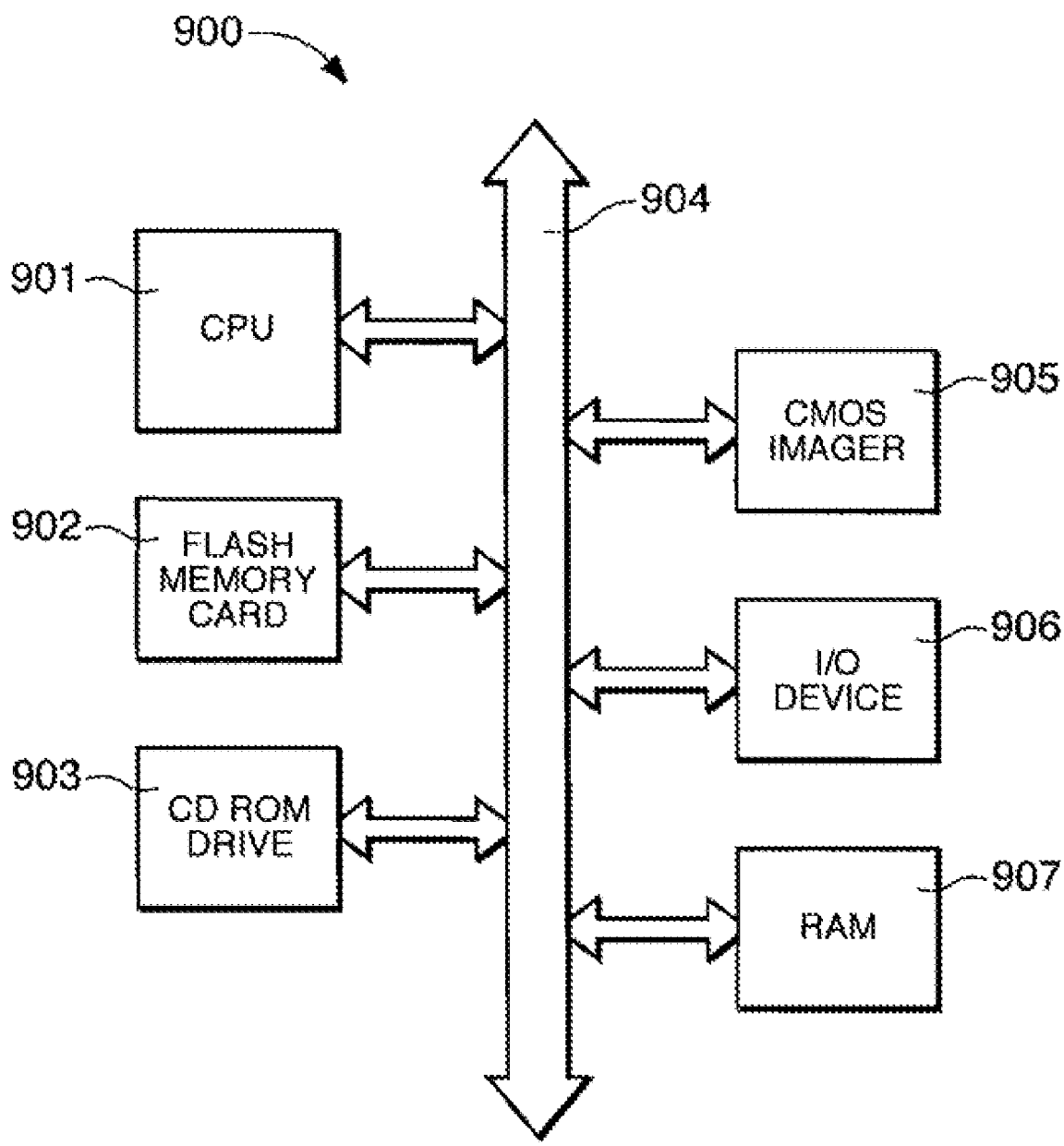
FIG. 9 represents a system used to employ any one of the embodiments of the present disclosure.

FIG. 9 depicts a processor system having digital circuits, which could include any of the CMOS imager sensor devices, having conductive material, preferably an optically clear conductive material, to isolate overlying metal lines from underlying photodiode regions of an imager sensor pixel of the present disclosure and thus parasitic capacitance will be common to all imager sensor pixels in the imager array to help attenuate fixed pattern noise.

Referring to FIG. 9, a processor system 900, such as a computer system, generally comprises a central processing unit (CPU) 901, for example, a microprocessor that communicates with an input/output (I/O) device 906 over a bus 904. The CMOS imager sensor device 705 also communicates with the system over bus 904. The processor system 900 may also include random access memory (RAM) 907, and, in the case of a computer system, may include peripheral devices such as a flash memory card 902, or a compact disk (CD) ROM drive 903 which also communicate with CPU 901 over the bus 904. It may also be desirable to integrate the CPU 901, CMOS imager sensor device 905 and memory 907 on a single IC chip. Without being limiting, such a processor system could include a computer system, camera system, scanner, machine vision, vehicle navigation, video phone, surveillance system, auto focus system, star tracker system, motion detection system, imager stabilization system and data compression system for high-definition television, all of which can utilize the invention.

It should be noted that although the present disclosure has been described with specific reference to CMOS imager sensor devices having an optically clear conductive ground plane residing between a photodiode region and metal interconnect lines, the invention has broader applicability and may be used in any imaging apparatus. The above description and drawings illustrate preferred embodiments which achieve the objects, features and advantages of the invention. It is not intended that the present disclosure be limited to the illustrated embodiments and any modification thereof which comes within the spirit and scope of the following claims should be considered part of the present disclosure.

What is claimed is:
1. An imager sensor comprising:
 a plurality of pixels each one including a photodiode region that generates charge in response to receiving light, wherein the photodiode of said the plurality of pixel is in a lower region of the imager sensor;

a plurality of first and second conductor lines located in an upper region of the imager sensor;

an optically clear conductive material extending horizontally across the plurality of pixels of the imager sensor and vertically located between the upper region containing the first and second conductor lines and the lower region containing the photodiode regions, the optically clear conductive material providing a conductive ground plane to shield the photodiode regions from parasitic capacitance coupling with the first and second conductor lines.

2. The imager sensor of claim 1 wherein the optically clear conductive material comprises either indium oxide ($In_2O_3$), tin oxide ($SnO_2$), or indium tin oxide ($In_x Sn_y Oz$).

* * * * *